United States Patent [19]

Shanley

[11] 4,430,596
[45] Feb. 7, 1984

[54] TEMPERATURE INSENSITIVE PIEZOELECTRIC CRYSTAL MOUNTING ARRANGEMENT

[75] Inventor: Charles W. Shanley, Plantation, Fla.

[73] Assignee: Motorola, Inc., Schaumburg, Ill.

[21] Appl. No.: 408,409

[22] Filed: Aug. 16, 1982

[51] Int. Cl.³ .............................................. H01L 41/08
[52] U.S. Cl. .................................... 310/348; 310/353; 310/346; 310/361
[58] Field of Search ................ 310/346, 348, 351–355, 310/361

[56] References Cited

U.S. PATENT DOCUMENTS

| | | |
|---|---|---|
| 2,284,284 | 5/1942 | Gerber . |
| 2,410,825 | 11/1946 | Lane . |
| 2,639,393 | 5/1953 | Birt et al. . |
| 2,771,561 | 11/1956 | Fuller .............................. 310/348 X |
| 3,069,572 | 12/1962 | Dick et al. .......................... 310/353 |
| 3,073,975 | 1/1963 | Bigler et al. ..................... 310/348 X |
| 3,527,967 | 9/1970 | Dyer et al. . |
| 4,112,323 | 9/1978 | Kawashima . |
| 4,266,157 | 5/1981 | Peters ..................................... 310/353 |
| 4,282,454 | 8/1981 | Wakat, Jr. et al. . |
| 4,292,562 | 9/1981 | Feder . |
| 4,357,554 | 11/1982 | Peters ............................... 310/353 X |

FOREIGN PATENT DOCUMENTS 131117 6/1978 Fed. Rep. of Germany ...... 310/348

OTHER PUBLICATIONS

"Effect of Internal Stress in Vibrating Quartz Plates" Ballato, A. D., and Bechman, R., Proc. IRE 48 (1960).
"The Force Sensitivity of AT Cut Quartz Crystals", Ratajski, Proc. 20th Annual Frequency Control Symposium (1966).
"Stress Induced Frequency Shifts in Thickness Mode Quartz Resonators." Sinha, B. K., Proc of the 1980 IEEE Ultrasonic Symposium.

Primary Examiner—Mark O. Budd
Attorney, Agent, or Firm—Mark P. Kahler; Edward M. Roney; James W. Gillman

[57] ABSTRACT

A crystal mounting arrangement is provided which achieves central mounting of the crystal on a substrate while not producing frequency changes in the crystal resulting from substantial differential expansion type stress generated over changes in temperature.

16 Claims, 7 Drawing Figures

TEMPERATURE INSENSITIVE PIEZOELECTRIC CRYSTAL MOUNTING ARRANGEMENT

BACKGROUND OF THE INVENTION

This invention relates to support structures for piezoelectric crystals and, more particularly to support structures for piezoelectric crystals which do not degrade the frequency stability of such crystals with changes in temperature.

DESCRIPTION OF THE PRIOR ART

A conventional arrangement for supporting a crystal 10 is shown in FIG. 1. Such a crystal mounting arrangement is described and claimed in U.S. Pat. No. 4,282,454, entitled "Piezoelectric Crystal Mounting and Connection Arrangement", issued to Wakat, Jr., et al. on Aug. 4, 1981, and having the same Assignee as the present invention. The contents of such U.S. Pat. No. 4,282,454 are incorporated herein by reference. A "Method of Making Crystal Mounting and Connection Arrangement" is described and claimed in U.S. Pat. No. 4,334,343 issued to the same inventive entity and Assignee on June 15, 1982. The contents of such U.S. Pat. No. 4,334,343 are incorporated herein by reference.

Referring now to the cross sectional view of FIG. 1, Crystal 10 of such conventional crystal mounting arrangement includes opposed major surfaces, namely upper surface 12 and lower surface 14. Those skilled in the art also refer to crystals, such as 10, as crystal plates. Electrodes 20 and 22 are situated substantially opposite each other on surfaces 12 and 14, respectively. Electrode 20 is electrically coupled to the peripheral edge region 25 of crystal 10 via a lead attachment tab and bonding pad 24 of electrically conductive material which extends from electrode 20 to the edge 25 of the crystal 10. Electrodes 30 and 32 are situated on upper surface 12 and lower surface 14, respectively as shown in FIG. 1. A lead attachment tab and bonding tab 34 of electrically conductive material electrically couples electrode 30 to the peripheral edge region 25 of crystal 10 as shown in FIG. 1. Electrodes 20 and 22 act together to form a resonator 26. Electrodes 30 and 32 act together to form a resonator 36.

One type of crystal which may be mounted employing the mounting arrangement shown in FIG. 1 is a monolithic crystal filter, although other piezoelectric crystal structures may likewise be mounted. In the case of a monolithic crystal filter, resonators 26 and 36 are situated sufficiently close together at appropriate locations on crystal 10 such that significant acoustic coupling exists between such resonators.

As seen in FIG. 1, a lower mounting pad 40 of electrically conductive material is situated at the center of lower crystal surface 14. In the case of the aforementioned yet to be mounted monolithic crystal filter, a runner 42 of electrically conductive material is situated on lower surface 14 in a manner electrically connecting electrode 22 to lower mounting pad 40. Similarly, a runner 44 of electrically conductive material is situated on lower surface 14 electrically coupling electrode 32 to lower mounting pad 40. Thus, electrodes 22 and 32 are electrically connected to pad 40, such that electrodes 22 and 32 may be conveniently coupled to external electrical circuitry via lower mounting pad 40.

According to the mounting arrangement of U.S. Pat. No. 4,282,454, the aforementioned monolithic crystal filter or other resonator structure to be mounted, is situated above a substrate 50 of electrically insulative material as shown in FIG. 1. More specifically, substrate 50 includes a raised portion 52 of electrically conductive material situated on substrate 50 so as to receive lower mounting pad 40, thereon. A layer of electrically conductive epoxy 45, both mechanically and electrically connects lower mounting pad 40 to raised portion 52. The geometry of raised portion 52 may be substantially circular or split into two semi-circular raised portions, if necessary due to external circuit constraints.

Pads 60 and 62 of electrically conductive material are situated on substrate 50 in proximity to edge 25 of crystal 10 adjacent resonators 26 and 36, respectively. In accordance with the teachings of the aforementioned patents, a flexible wire bond 64 having opposed ends is employed to electrically couple lead attachment tab 24 to conductive pad 60 such that resonator 26 may be coupled to external electrical circuitry. In a like manner, a flexible wire bond 66 having opposed ends is employed to electrically couple lead attachment tab 34 to conductive pad 62, such that resonator 36 may be conveniently connected to external electrical circuitry.

FIG. 2 is a top view of the conventional crystal mounting arrangement depicted in cross section in FIG. 1. The X and Z crystallographic reference coordinate axes of crystal 10 are clearly shown in FIG. 2. For convenience, crystal 10 which exhibits a substantially circular geometry, is provided with a flat portion 11 which is parallel to the Z crystal-lographic axis of crystal 10. It is noted that the X and Z axes exhibit an orthogonal relationship to each other. The Y crystallographic axis (not shown) is orthogonal to the X and Z axes. The circular raised portion 52 which supports crystal 10 is shown as a circular dashed line in the top view of the conventional crystal mounting arrangement shown in FIG. 2.

Although the crystal mounting arrangement depicted in FIGS. 1 and 2 performs well to support crystal 10 and provide electrical connection thereto, it is found that when such crystal mounting arrangement is subjected to changes of temperature, differential thermal expansion results between raised portion 52 on substrate 50 and crystal plate 10. Such differential thermal expansion causes stresses to be generated in crystal plate 10 which tend to result in changes of the resonant frequency of resonators disposed on crystal plate 10 in excess of those normally observed for an AT cut crystal. In some applications, such frequency variation over temperature change may be undesirable.

It is one object of the present invention to provide a crystal mounting arrangement which does not substantially affect the resonant frequency of resonators disposed on a piezoelectric crystal plate when the crystal plate is subjected to temperature changes.

This and other objects of the invention will become apparent to those skilled in the art upon consideration of the following description of the invention.

BRIEF SUMMARY OF THE INVENTION

The present invention is directed to providing a piezoelectric crystal mounting arrangement which results in the crystal being relatively insensitive to changes in temperature tending to cause changes in the resonant frequency of resonators disposed on such crystal.

In accordance with one embodiment of the invention, the piezoelectric crystal mounting arrangement includes a substrate of electrically insulative material. The mounting arrangement further includes a piezoelectric crystal plate having opposed upper and lower surfaces. At least one electrode is disposed on the upper surface of the crystal plate, and at lease one electrode is disposed on the lower surface of the crystal plate. The crystal plate exhibits X, Y, and Z reference coordinate axes. A plurality of pedestals are situated on the substrate and are oriented so as to contact and support the crystal plate along at least one selected axis thereof which exhibits piezoelectric coefficients substantially insensitive to stress applied to the crystal plate.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DETAILED DESCRIPTION OF THE PREFERRED EMBODIMENT

Figure 1:
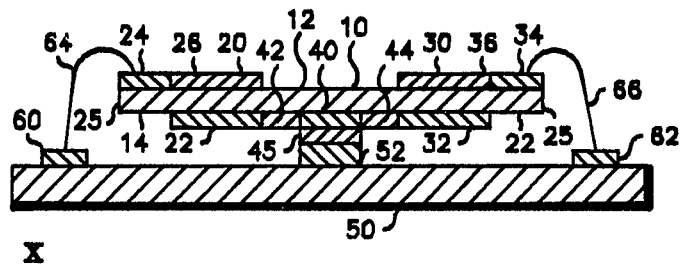
FIG. 1 is a cross-sectional representation of a conventional center supported piezoelectric crystal mounting arrangement.
Figure 2:
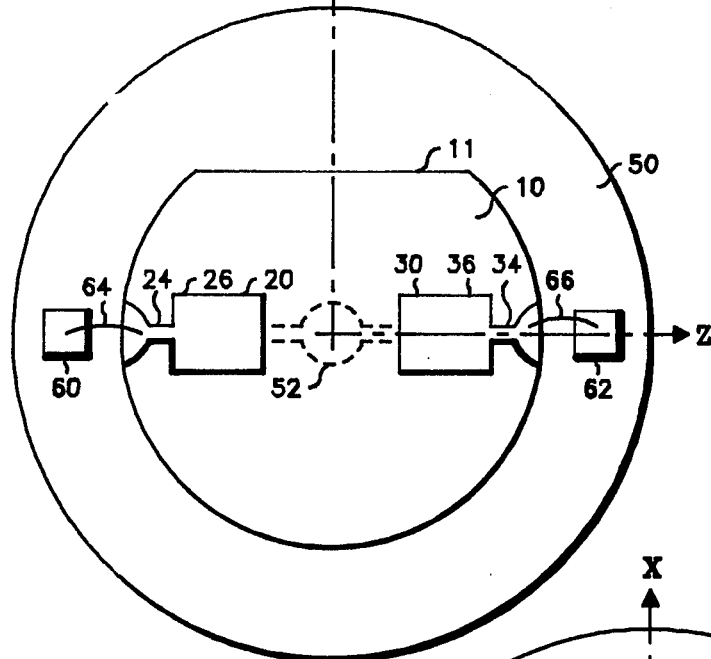
FIG. 2 is a top view of the conventional crystal mounting arrangement of FIG. 1.
Figure 3A:
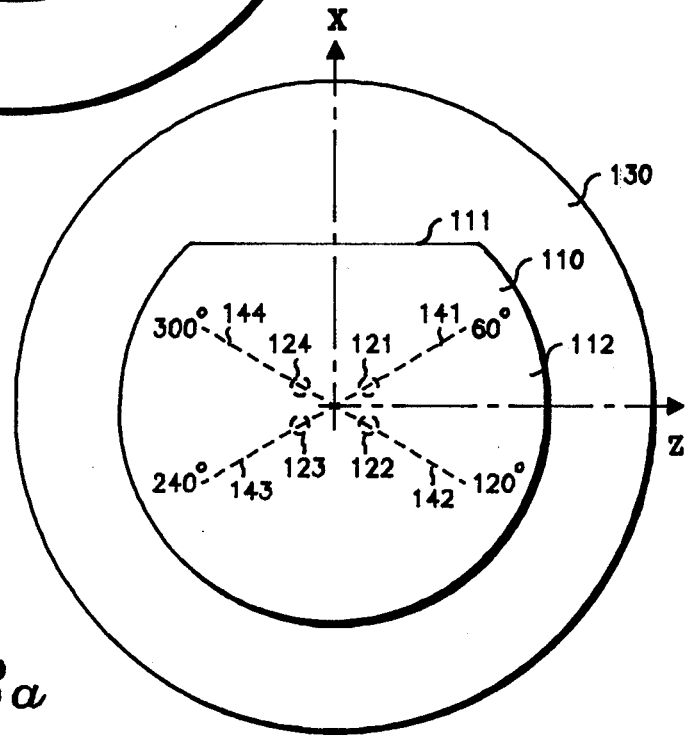
FIG. 3A is a simplified representation of a top view of the crystal mounting arrangement of the present invention showing a plurality of support pedestals below the crystal.

FIG. 3A illustrates a simplified top view of the crystal mounting arrangement of the present invention. Such crystal mounting arrangement includes a piezoelectric crystal plate 110 exhibiting X, Y, and Z reference coordinate (crystallographic) axes. The X and Z crystallographic axes of crystal plate 110 which exhibits an AT cut in this embodiment of the invention, are clearly shown in FIG. 3A. The X crystallographic axis is perpendicular to a reference flat 111 which is formed at the edge of crystal 110 in a direction parallel to the Z crystallographic axis. For purposes of simplicity, crystal 110 is shown without any electrode configurations disposed on the upper surface 112 thereof. In actual practice, such electrode configurations take the form of resonator and/or filter metallizations.

Crystal 110 is situated atop a plurality of electrically conductive pedestals 121, 122, 123, and 124 which are situated on a substrate 130 of electrically insulative material as shown in FIG. 3A. It is found that the following axes in the X-Z plane of crystal 110 exhibit piezoelectric coefficients which are substantially insensitive to stresses applied to or generated in crystal 110: an axis 141 situated on crystal 110 at approximately 60° measured clockwise from the X crystallographic axis thereof, an axis 142 situated on crystal 110 at approximately 120° measured clockwise from the X crystallographic axis thereof, an axis 143 situated on crystal 110 at approximately 240° measured clockwise from the X crystallographic axis thereof and axis 144 situated on crystal 110 at approximately 300° measured clockwise from the X crystallographic axis of crystal 110. That is, stresses generated in crystal 110 by differential thermal expansion of substrate 130 and crystal 110 over changes in temperature do not substantially change the piezoelectric coefficients exhibited by axes 141–144.

Pedestals 121, 122, 123, and 124 are appropriately located on substrate 130 such that when crystal 110 is situated atop such pedestals, pedestals 121, 122, 123, and 124 are aligned with and contact axes 141, 142, 143, and 144, respectively of crystal 110. Pedestals 121–124 are conveniently secured to the bottom surface of crystal 110 via respective layers of electrically conductive epoxy (not shown in FIG. 3A). Electrical connection between electrodes situated on the bottom surface of crystal 110 and locations on substrate 130 may thus be conveniently achieved.

The crystal mounting arrangement of FIG. 3A achieves crystal mounting in a manner which permits crystal 110 to be operated over a relatively wide temperature range without inducing substantial stresses in such crystal 110 due to differential thermal expansion between substrate 130 and crystal 110. This is so because the aforementioned pedestals 121–124 which support crystal 110 are situated on substrate 130 in positions which permit such pedestals to contact crystal 110 on respective axes which exhibit piezoelectric coefficients which remain substantially constant despite stresses induced in crystal 110 by changes in temperature. Thus, the operating frequency or frequencies of crystal 110 are not substantially affected by changes in ambient temperature.

Although in the embodiment of FIG. 3A, pedestals 121–124 are located near the center 150 of crystal 110, it will be appreciated that such pedestals may alternatively be located closer to the edge of crystal 110 than shown, provided that such pedestals are situated along the aforementioned crystallographic axes 141, 142, 143, and 144. Further, although in FIG. 3A, substantially circular pedestals are employed for pedestals 121–124, other cross section geometries such as elliptical, oval, substantially cylindroidal, square, and rectangular, for example, may be employed providing such pedestals are confined to contactng crystal 110 along the aforementioned crystallographic axes 141, 142, 143, and 144.

Figure 3B:
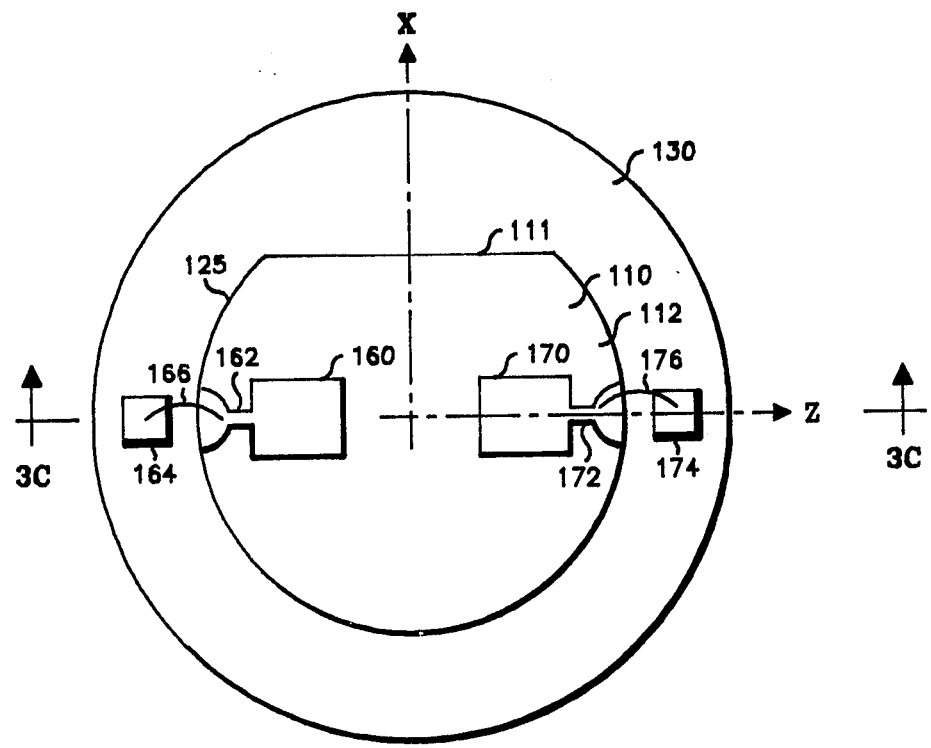
FIG. 3B is a simplified representation of a top view of the crystal mounting arrangement of the present invention.

FIG. 3B shows a somewhat more detailed representation of the crystal mounting arrangement of FIG. 3A. Like numbers indicate like elements. More specifically, crystal 110 of FIG. 3B clearly shows various electrode metallizations on upper surface 112 which are to be electrically connected to various electrically conductive regions situated on substrate 130. By way of example, electrodes 160 and 170 are situated on the upper surface 112 of crystal 110. Electrodes 160 and 170 are electrically coupled to the outer peripheral edge 125 of crystal 110 via lead attachment tabs and bonding pads 162 and 172. Lead attachments tabs 162 and 172 are conveniently flared or widened as the edge of the crystal is approached by such respective pads to facilitate wire bonding thereto as discussed subsequently.

Electrically conductive regions 164 and 174 are situated on substrate 130 at loci adjacent the edge 125 of crystal 110 and bonding pads 162 and 172, respectively. To electrically couple electrode 160 to conductive region 164, a flexible wire bond 166 has its opposed ends respectively wire-bonded to conductive region 164 and bonding pad 162 in accordance with the teachings of the above-incorporated U.S. Pat. Nos. 4,282,454 and 4,334,343. In a like manner, to electrically couple electrode 170 to conductive region 174, a flexible wire bond 176 has its opposed ends wirebonded to bonding pad 172 and conductive region 174, respectively in accordance with the aforementioned patents.

Figure 3C:
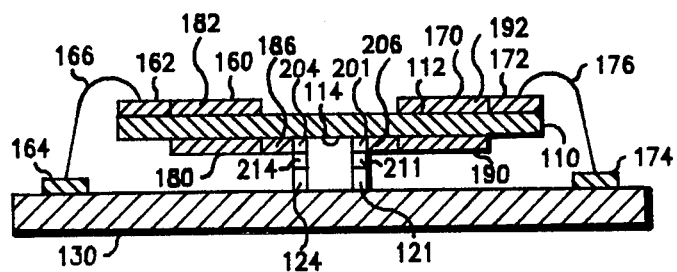
FIG. 3C is a more detailed cross section of the crystal mounting arrangement of FIG. 3A.

FIG. 3C is a cross-section of the crystal mounting arrangement of FIG. 3B taken along cross section line 3C–3C of FIG. 3B. FIG. 3C more clearly shows the various metallizations on the upper surface 112 and the lower surface 114 of crystal plate 110 as well as the flexible wire bonds 166 and 176 which couple crystal 110 to external electrical circuitry. Analyzing FIG. 3C with respect to FIG. 3B, like numbers indicate like elements. For sake of completeness, however, the entire structure shown in FIG. 3C will now be briefly discussed.

Electrodes 160 and 170 are disposed on upper surface 112 of crystal plate 110. Electrodes 180 and 190 are disposed on lower surface 114 immediately opposite electrodes 160 and 170, respectively. Electrodes 160 and 180 act together to form a resonator 182. Similarly, electrodes 170 and 190 act together to form a resonator 192. As seen in FIG. 3C, pedestals 121 and 124 (as well as pedestals 122 and 123, not shown) are contacted by electrically conductive pedestal receiving pads 201 and 204, respectively. Pedestal receiving pads 201 and 204 are appropriately situated on the lower surface 114 of crystal 110 on axes 144 and 141, respectively in accordance with the previous discussion. Electrode 180 is electrically coupled to pedestal receiving pad 204 via a runner 186 of electrically conductive material situated therebetween. In a similar manner, pedestal receiving pad 201 is electrically coupled to electrode 190 via a runner 206 of electrically conductive material situated therebetween. Thus, electrodes 180 and 190 are electrically coupled to pedestals 124 and 121, respectively, and external electrical circuitry connected to such pedestals. Layers 211 and 214 of electrically conductive epoxy are employed to electrically and mechanically connect pedestal 121 to pedestal receiving pad 201 and to so connect pedestal 124 to pedestal receiving pad 204, respectively. Flexible wire bonds 166 and 176 have already been fully discussed.

It is understood that the particular electrode configuration shown in FIGS. 3B and 3C is given merely by way of example. Virtually any electrode configuration, whether for purposes of filtering or oscillation or otherwise, may be adapted to be situated in the crystal mounting structure exemplified in FIGS. 3B and 3C.

Figure 4:
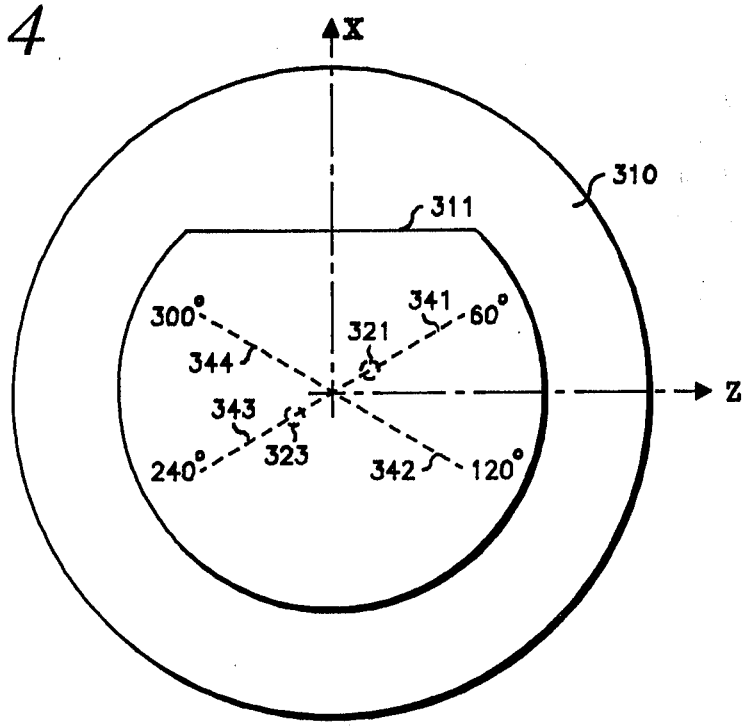
FIG. 4 is a simplified representation of a top view of another embodiment of the crystal mounting arrangement of the present invention.
Figure 5:
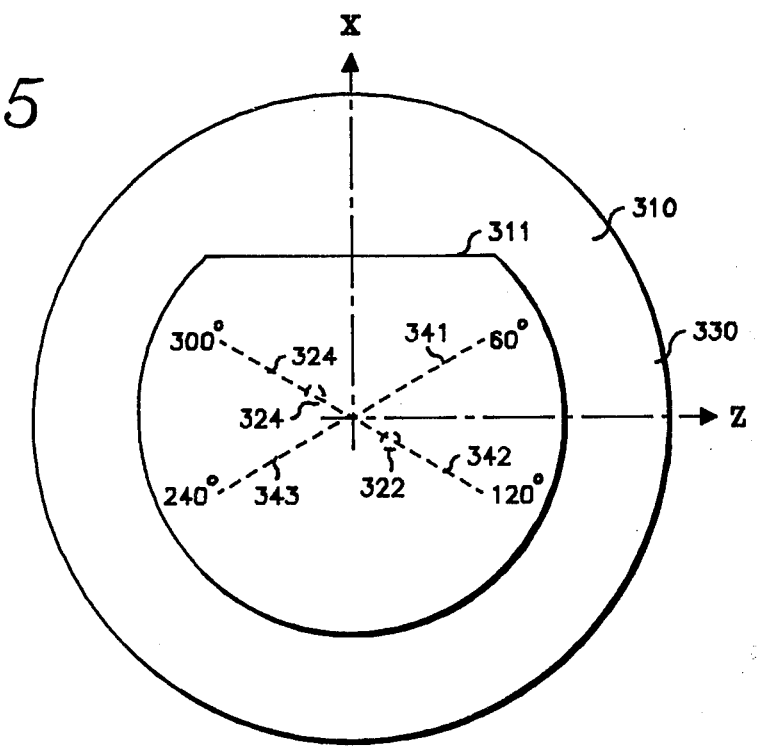
FIG. 5 is a top view of yet another embodiment of the crystal mounting arrangement of the present invention.

FIG. 4 illustrates a top view of an alternative embodiment of the present crystal mounting arrangement invention. An AT cut crystal 310 to be mounted exhibits X, Y, and Z crystallographic axes with a flat 311 being situated in crystal 310 parallel with the Z crystallographic axes. The aforementioned substantially dimensionally temperature insensitive axes for an AT cut crystal such as crystal 310 are designated 341, 342, 343, and 344. Axes 341, 342, 343, and 344 are respectively situated at approximately 60°, 120°, 240°, and 300°, with respect to the X crystallographic axes. In this embodiment of the invention, pedestals such as those described above under the discussion of FIGS. 3A–3C are situated on each of two diametrically opposed axes selected from axes 341, 342, 343 and 344. For example, as in FIG. 4, pedestals 321 and 323 are situated on diametrically opposed axes 341 and 343. Alternatively, as shown in FIG. 5, pedestals 322 and 323 are situated along diametrically opposed axes 342 and 344. For purposes of this specification, pedestals are defined to be diametrically opposed when such pedestals and the intersection of the X-Z crystallographic axes are substantially collinear, and such pedestals are on opposed sides of the intersection of the X-Z axes.

The foregoing describes a crystal mounting arrangement in which the mounted crystal is substantially unaffected in terms of stress placed thereon over changes in temperature.

While only certain preferred features of the invention have been shown by way of illustration, many modifications and changes will occur to those skilled in the art. It is, therefore, to be understood that the present claims are intended to cover all such modifications and changes that fall within the true spirit of the invention.

What is claimed is:

1. A piezoelectric crystal mounting arrangement comprising:

a substrate of electrically insulative material;

an AT cut piezoelectric crystal plate having a center and opposed upper and lower surfaces with at least one electrode disposed on the upper surface of said crystal plate and at least one electrode disposed on the lower surface of said crystal plate, said crystal plate exhibiting X, Y, and Z reference coordinate axes, and four support pedestals, each pedestal being situated on said substrate and being oriented so as to contact and support said crystal plate along a respective one of four axes of said crystal plate situated at angles of approximately 60°, 120°, 240°, and 300° with respect to the X axis of said crystal plate, the angle of each of said axes being selected to minimize stress exerted on said crystal plate by the differential thermal expansion of said crystal plate with respect to said substrate and pedestals, said four pedestals being substantially centrally situated on said crystal plate, said four pedestals being arranged on said substrate so as to form the four corners of a four-sided polygon, the center of said crystal plate being situated above and laterally within said four-sided polygon formed by said pedestals.

2. The crystal mounting arrangement of claim 1 including at least one electrically conductive lead attachment tab situated on the upper surface of said crystal plate, extending from each electrode thereon to the periphery of said plate;

at least one conductive region situated on said substrate, and flexible wire bonds electrically coupling respective ones of said lead attachment tabs to respective ones of said conductive regions.

3. The crystal mounting arrangement of claim 1 including a plurality of electrically conductive pad situated on the lower surface of said crystal plate, each of said pads being oriented on said crystal plate as to receive one of said pedestals in contact therewith.

4. The crystal mounting arrangement of claim 3 wherein said electrically conductive pads are electrically coupled to at said at least one electrode dispossed on the lower surface of said substrate.

5. The crystal mounting arrangment of claim 2 including a plurality of electrically conductive pads situated on the lower surface of said crystal plate, each of said pads being oriented on said crystal plate so as to receive one of said pedestals in contact therewith.

6. The crystal mounting arrangement of claim 5 wherein said electrically conductive pads are electrically coupled to said at least one electrode dispossed on the lower surface of said substrate.

7. The crystal mounting arrangement of claim 1 wherein said pedestals exhibit a circular geometry.

8. The crystal mounting arrangement of claim 1 wherein said pedestals exhibit substantially cylindroidal geometry.

9. A piezoelectric crystal mounting arrangement comprising:

a substrate of electrically insulative material;

an AT cut piezoelectric crystal plate having a center and opposed upper and lower surfaces, with at least one electrode disposed on the upper surface of said crystal plate and at least one electrode disposed on the lower surface of said crystal plate, said crystal plate exhibiting X, Y, and Z reference coordinate axes, and four support pedestals, each pedestal being situated on said substrate and being oriented so as to contact and support said crystal plate along a respective one of four axes of said crystal plate situated at angles of approximately 60°, 120°, 240°, and 300° with respect to the X axis of said crystal plate, the angle of each of said axes being selected to minimize stress exerted on said crystal plate by the differential thermal expansion of said crystal plate with respect to said substrate and pedestals, said four pedestals being substantially centrally situated on said crystal plate, said four pedestals being arranged on said substrate so as to form the four corners of a rectangle, the center of said crystal plate being situated above and laterally within said rectangle formed by said pedestals.

10. The crystal mounting arrangement of claim 9 including at least one electrically conductive lead attachment tab situated on the upper surface of said crystal plate extending from each electrode thereon to the perifere of said plate;

at least one electrically conductive region situated on said substrate, and flexible wire bonds electrically coupling respective ones of said lead attachment tabs to respective ones of said electrically conductive regions.

11. The crystal mounting arrangement of claim 9 including a plurality of electrically conductive pads situated on the lower surface of said crystal plate, each of said pads being oriented on said crystal plate so as to receive one of said pedestals in contact therewith.

12. The crystal mounting arrangement of claim 11 wherein said electrically conductive pads are electrically coupled to said at least one electrode disposed on the lower surface of said substrate.

13. The crystal mounting arrangement of claim 10 including a plurality of electrically conductive pads situated on the lower surface of said crystal plate, each of said pads being oriented on said crystal plate so as to receive one of said pedestals in contact therewith.

14. The crystal mounting arrangement of claim 13 wherein said electrically conductive pads are electrically coupled to at least one electrode disposed on the lower surface of said substrate.

15. The crystal mounting arrangement of claim 9 wherein said pedestal exhibits a circular geometry.

16. The crystal mounting arrangement of claim 9 wherein said pedestal exhibits a substantially cylindroidal geometry.

* * * * *